(12) United States Patent
Ito

(10) Patent No.: US 7,559,042 B2
(45) Date of Patent: Jul. 7, 2009

(54) LAYOUT EVALUATING APPARATUS

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 285 days.

(21) Appl. No.: 11/560,484

(22) Filed: Nov. 16, 2006

(65) Prior Publication Data
US 2008/0022238 A1    Jan. 24, 2008

(30) Foreign Application Priority Data
Jul. 24, 2006    (JP) .............................. 2006-200992

(51) Int. Cl.
*G06F 17/50*    (2006.01)
(52) U.S. Cl. ................ 716/4; 716/11; 716/12; 716/18
(58) Field of Classification Search ............... 716/2, 716/4, 18, 12, 11
See application file for complete search history.

(56) References Cited

U.S. PATENT DOCUMENTS

| | | | |
|---|---|---|---|
| 5,818,727 A * | 10/1998 | Sekiguchi .................... | 716/18 |
| 6,321,370 B1 * | 11/2001 | Suzuki et al. ................. | 716/11 |
| 6,463,567 B1 | 10/2002 | Kozai | |
| 2002/0029371 A1 * | 3/2002 | Hwang et al. ................. | 716/10 |
| 2002/0056070 A1 * | 5/2002 | Tanaka ........................ | 716/2 |
| 2002/0157080 A1 * | 10/2002 | Kato et al. .................... | 716/18 |

FOREIGN PATENT DOCUMENTS

| | | |
|---|---|---|
| JP | 7-56982 | 3/1995 |
| JP | 2000-76321 | 3/2000 |

OTHER PUBLICATIONS

Prabhakar Kudva et al., "Metrics for Structural Logic Synthesis" Proc. of ICCAD, pp. 551-556, 2002.
Qinghua Liu et al., "Pre-layout Wire Length and Congestion Estimation", Proc. of DAC 2004, pp. 582-587, 2004.

* cited by examiner

*Primary Examiner*—Paul Dinh
*Assistant Examiner*—Suchin Parihar
(74) *Attorney, Agent, or Firm*—Staas & Halsey LLP

(57) ABSTRACT

To provide a layout evaluating apparatus that can determine the feasibility of a layout from information only about a netlist, the layout evaluating apparatus is made to comprise a first individual index value generating unit for generating first individual index values, a second individual index value generating unit for generating second individual index values, a correlation extracting unit for generating an evaluation expression, which is an evaluation expression for calculating a second index value from the second individual index values and by which the second index value and its block size have a correlation, and a layout evaluating unit for identifying a range where the second index value and its block size have a correlation and for determining that a layout is possible if the first index value, which is obtained by substituting the first individual index values into the evaluation expression as a replacement for the second individual index values, is included in the correlation range.

13 Claims, 13 Drawing Sheets

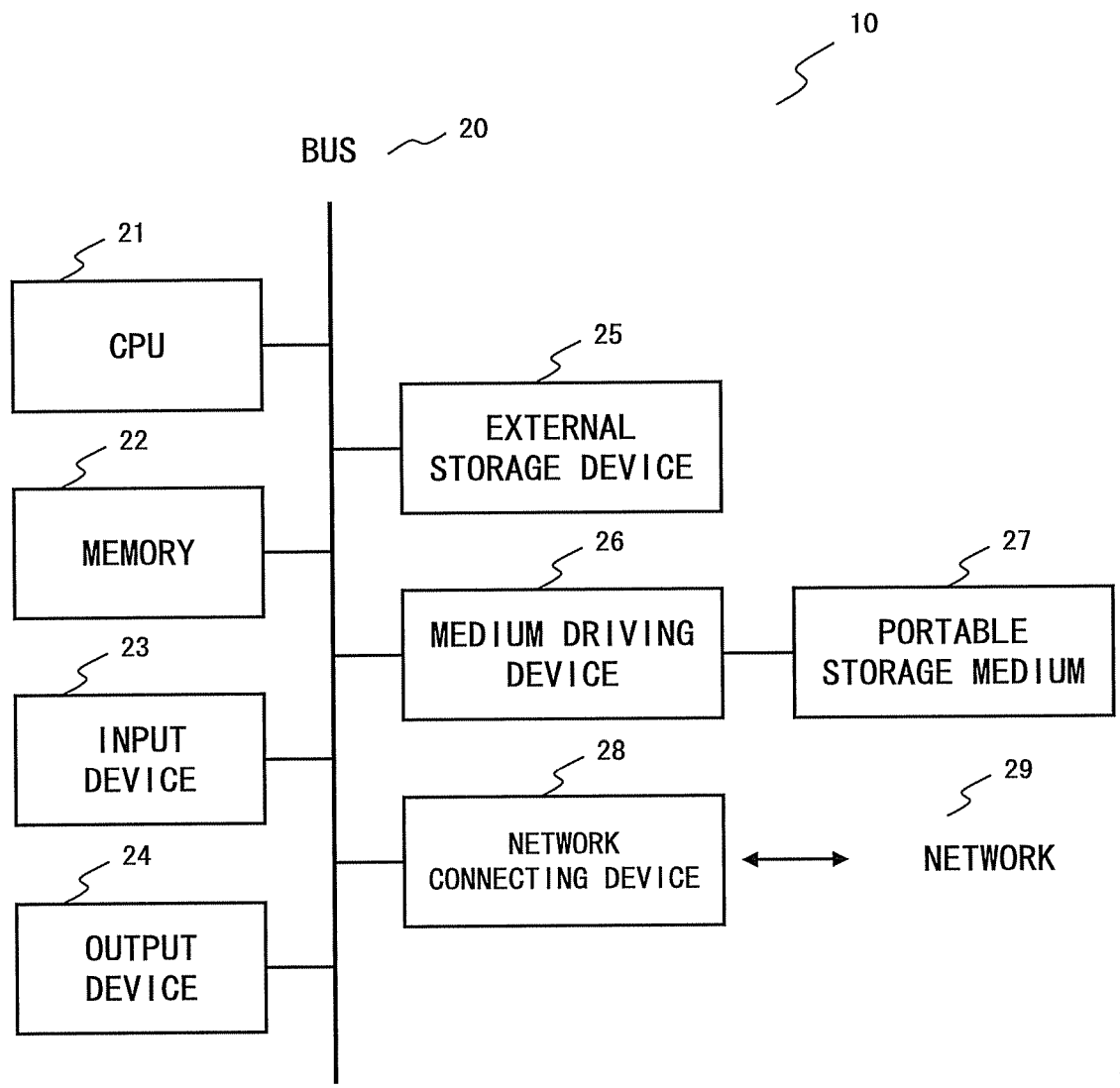
F I G. 2

| NETLIST No. | INDIVIDUAL INDEX VALUE 1 | INDIVIDUAL INDEX VALUE 2 | . . . | INDIVIDUAL INDEX VALUE n |
|---|---|---|---|---|
| 1 | ○○ | △△ | . . . | □□ |
| 2 | | | . . . | |
| 3 | | | . . . | |
| ⋮ | | | | |
| n | | | . . . | |

| NETLIST No. | INDIVIDUAL INDEX VALUE 1 | INDIVIDUAL INDEX VALUE 2 | ... | INDIVIDUAL INDEX VALUE n | LAYOUT DB No. | BLOCK SIZE |
|---|---|---|---|---|---|---|
| 1 | ○○ | △△ | ... | □□ | 1 | ☆☆ |
| 2 | | | ... | | 2 | |
| 3 | | | ... | | 3 | |
| ... | ... | ... | ... | ... | ... | |
| n | | | ... | | n | |

50

| NET LIST No. | TOTAL AREA OF CELLS | NUMBER OF NETS | NUMBER OF PINS | INDEX VALUE |
|---|---|---|---|---|
| 1 | 7 | 10 | 17 | 72 |
| 2 | 10 | 10 | 18 | 88 |

F I G. 7

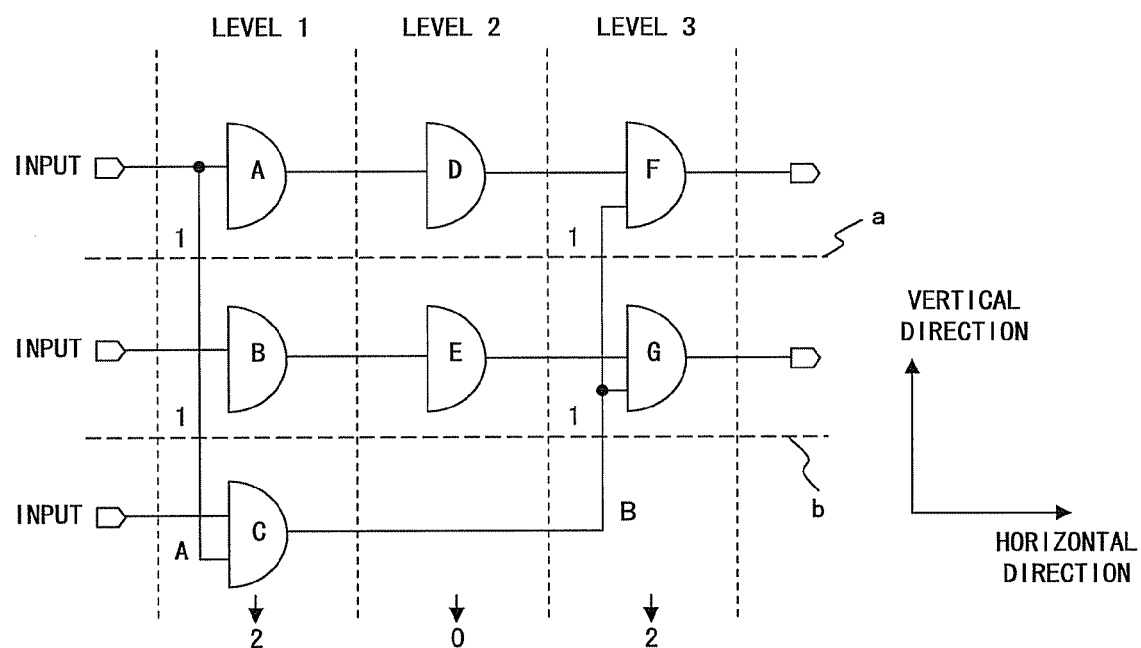
F I G. 9

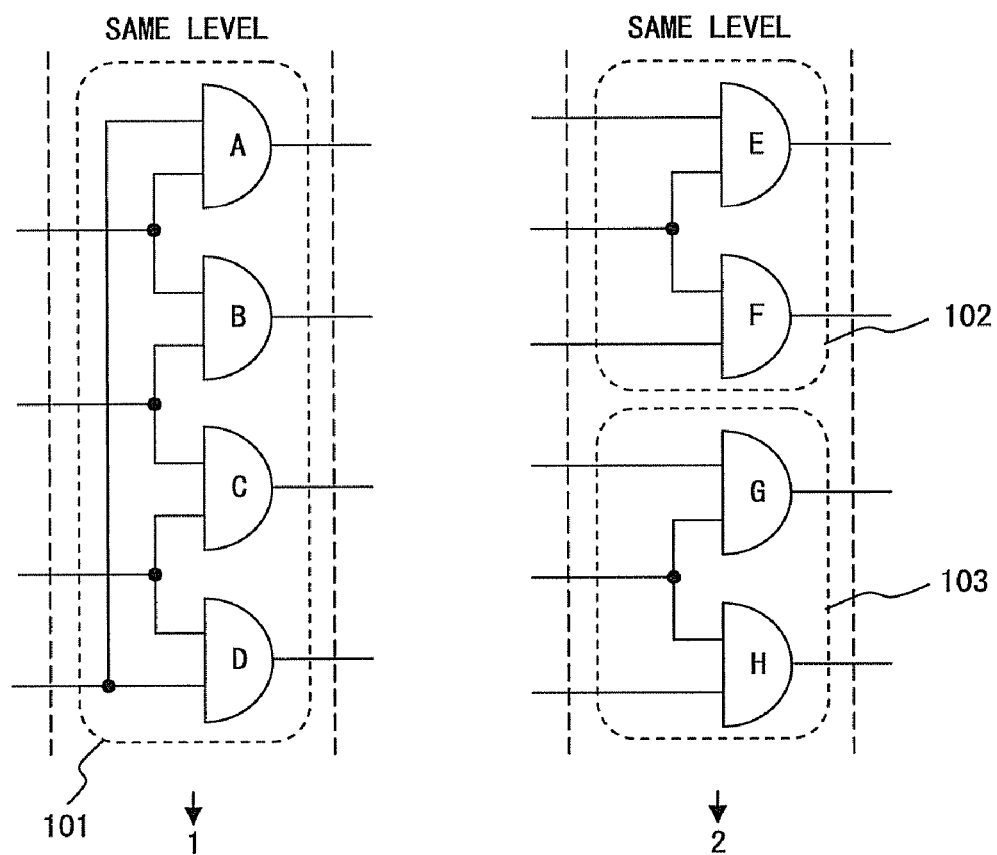
F I G. 10

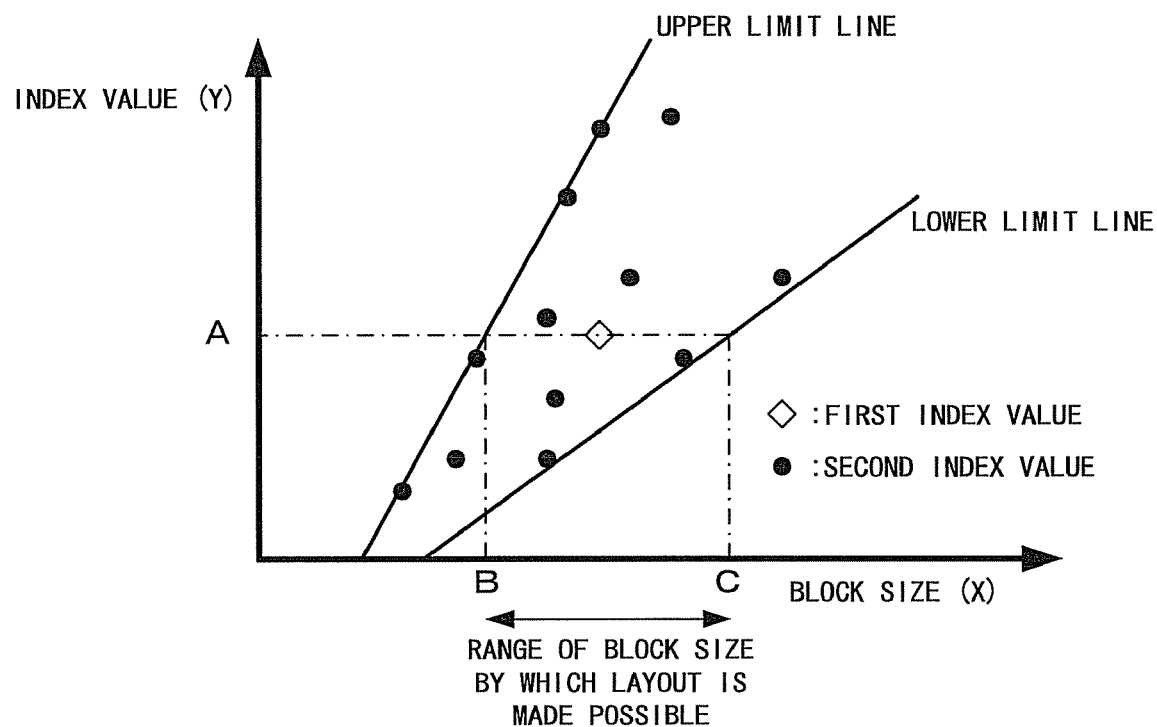
F I G. 1 2

LAYOUT EVALUATING APPARATUS

BACKGROUND OF THE INVENTION

1. Field of the Invention

The present invention relates to a layout evaluating apparatus for evaluating the feasibility of a layout of a circuit based on logic information such as a netlist, etc. prior to a layout design.

2. Description of the Related Art

In recent years, the scale and the density of an LSI have been increasing with the advance of manufacturing technologies, etc. Therefore, it has become vital to fully secure a layout process in the design process of an LSI.

The logic of an LSI peripheral to a CPU (hereinafter referred to as a peripheral LSI) significantly varies by generation unlike the arithmetic circuit of a CPU, etc. Accordingly, a block size by which a layout is made possible must be newly decided each time the logic varies.

However, since a considerable amount of time is required for the logic design process of a peripheral LSI due to an increase in the scale and the density of an LSI as described above, the stability of a netlist also requires a considerable amount of time. For this reason, a technique, with which the feasibility of a layout can be evaluated with short TAT (Turn Around Time: design/development duration) as soon as a netlist is created, becomes important.

If such an evaluation cannot be made, the feasibility of a layout is sometimes proved to be difficult at a stage of a layout process, for example, at a stage where the process proceeds to wiring operations. If such a case occurs, a logic design or a floor plan can be possibly changed, and a development schedule can be possibly behind.

Japanese Published Unexamined Patent Application No. H07-056982 discloses a layout method and a layoutability evaluating apparatus, which can shorten a layout time by evaluating the degree of difficulty of a layout of a designed circuit.

Additionally, Japanese Published Unexamined Patent Application No. 2000-076321 discloses an LSI design system and an LSI design method thereof, which grasp a chip size and a critical path in the initial stage of a design, and create a model of a functional block for an improvement.

Furthermore, in recent years, a technique for determining the degree of ease of a layout by creating an index from a netlist has been invented as disclosed by P. Kudva, A. Sullivan and W. Dougherty, "Metrics for Structural Logic Synthesis", Proc. of ICCAD, pp. 551-556, 2002, or Q. Liu, M. M. Sadowska, "Pre-layout Wire Length and Congestion Estimation", Proc. of DAC, pp. 582-587, 2004.

SUMMARY OF THE INVENTION

The present invention was developed in consideration of the above described problems, and aims at providing a layout evaluating apparatus for enabling the feasibility of a layout to be determined from information only about a netlist.

To overcome the above described problems, the layout evaluating apparatus according to the present invention, which is a layout evaluating apparatus for evaluating the feasibility of a layout of a circuit by using first logic information representing a connection state of the desired circuit, is made to comprise a first individual index value generating unit for generating one or more first individual index values, which become materials for determining whether or not a layout is possible, from the first logic information, a second individual index value generating unit for generating one or more second individual index values, which become materials for determining whether or not a layout is possible, from second logic formation for each piece of second logic information representing a connection state of a circuit the layout of which is designed to be possible, a correlation extracting unit for generating an evaluation expression for calculating a second index value so that the second index value, which is calculated with the second individual index values for each piece of the second logic information, and a block size in the second logic information have a correlation, and a layout evaluating unit for identifying a range where the second index value and the block size have the correlation in the second logic information, and for determining that a layout is possible if a first index value, which is calculated by replacing the second individual index values in the evaluation expression with the first individual index values, is included in the range.

According to the present invention, the second individual index value generating unit generates the second individual index values from the second logic information representing a connection state of a circuit the layout of which is already designed and verified to be possible, and the correlation extracting unit decides an evaluation expression so that the second index value, which is obtained by substituting the second individual index values into an evaluation expression, and its block size have a correlation.

Then, the layout evaluating unit identifies a range where the second index value and its block size have the correlation, and determines that a layout is possible if the first index value, which is obtained by substituting the first individual index values into the evaluation expression, is included in the range.

This produces an effect that the feasibility of a layout can be determined by using only logic information (first logic information) representing the connection state of a desired circuit.

As described above, according to the present invention, a layout evaluating apparatus that can determine the feasibility of a layout from information only about a netlist can be provided.

BRIEF DESCRIPTION OF THE DRAWINGS

FIG. 2 is a block diagram exemplifying a configuration of the layout evaluating apparatus according to the preferred embodiment of the present invention;

FIG. 4 is a schematic exemplifying the structure of a first individual index set according to the preferred embodiment of the present invention;

FIG. 5 is a schematic exemplifying a second index set according to the preferred embodiment of the present invention;

FIG. 7 is a schematic explaining first and second individual index values according to the preferred embodiment of the present invention;

FIG. 9 is a schematic showing the outline of a vertical direction wire amount calculation process according to the preferred embodiment of the present invention;

FIG. 10 is a schematic showing the outline of a vertical direction wire entanglement degree calculation process according to the preferred embodiment of the present invention;

FIG. 12 is a schematic exemplifying a correlation graph according to the preferred embodiment of the present invention.

DESCRIPTION OF THE PREFERRED EMBODIMENTS

A preferred embodiment according to the present invention is hereinafter described with reference to FIGS. 1 to 13.

Figure 1:
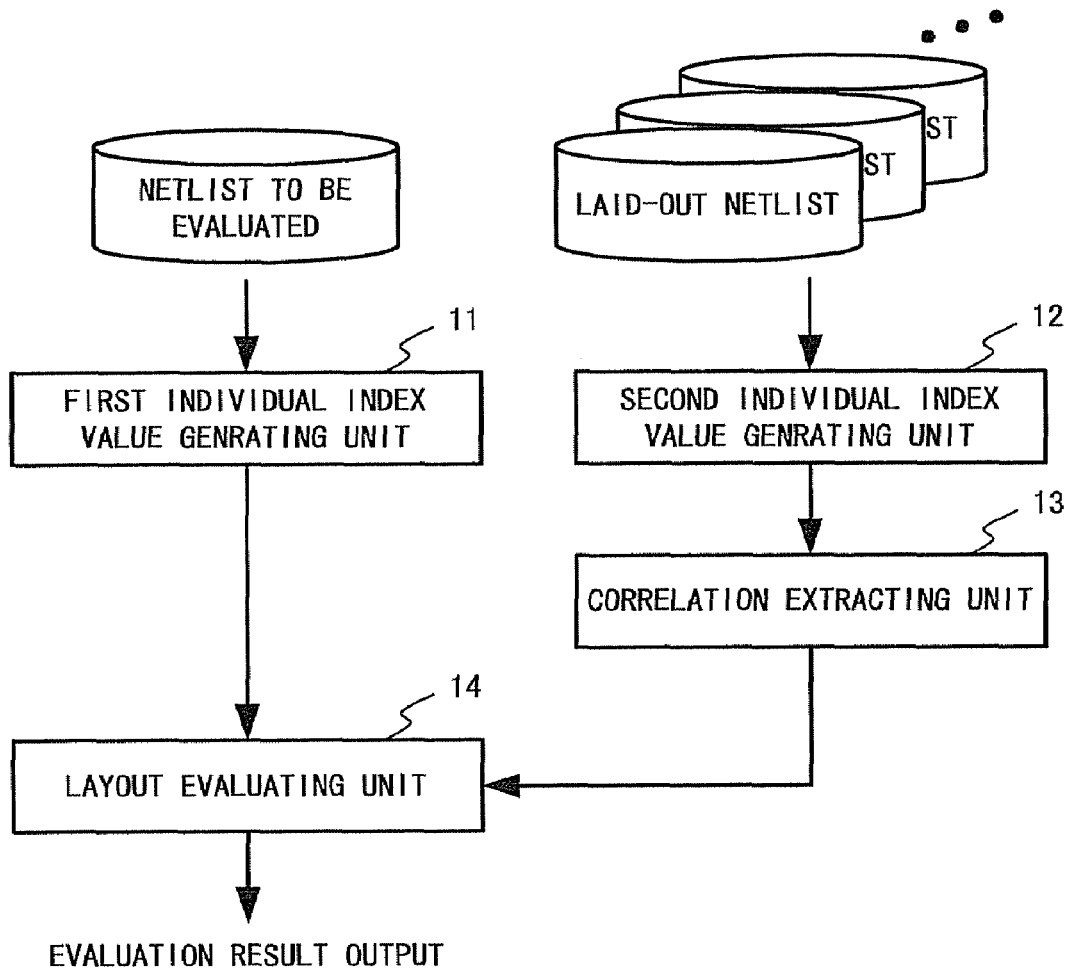
FIG. 1 is a schematic explaining the outline of a layout evaluating apparatus according to a preferred embodiment of the present invention.

FIG. 1 is a schematic explaining the outline of a layout evaluating apparatus 10 according to a preferred embodiment of the present invention.

The layout evaluating apparatus 10 shown in FIG. 1 comprises a first individual index value generating unit 11 for generating first individual index values from a netlist to be evaluated, a second individual index value generating unit 12 for generating second individual index values for each laid-out netlist, a correlation extracting unit 13 for generating an evaluation expression, which is an evaluation expression for calculating a second index value from the second individual index values, and by which the second index value and its block size have a correlation, and a layout evaluating unit 14 for identifying a range (hereinafter referred to as a correlation range) where the second index value and its block size have a correlation and for determining that a layout is possible if a first index value, which is obtained by substituting the first individual index values into the evaluation expression as a replacement for the second individual index values, is included in the correlation range.

Here, the netlist to be evaluated is a netlist to be evaluated, for which an evaluation of whether or not a layout is possible is conducted.

Additionally, the laid-out netlist is a netlist the layout of which is known to be possible and the block size of which is known as a result of completion of a layout design or circuit manufacturing based on the netlist.

Accordingly, for example, "the second index value and its block size" mean the second index value, which is obtained by substituting the second individual index values generated from a laid-out netlist into an evaluation expression, and a block size obtained as a result of completion of a layout design, etc. based on the same laid-out netlist.

The first individual index value generating unit 11 reads the number of cells, etc. from a netlist to be evaluated, and generates first individual index values. Similarly, the second individual index value generating unit 12 reads the number of cells, etc. from a laid-out netlist, and generates second individual index values.

In this preferred embodiment, one element (such as an AND circuit, a NAND circuit, an XOR circuit, etc.), which configures a circuit based on logic information such as a netlist, etc., is referred to as a cell, and a wire connecting elements is referred to as a net.

As the first and the second individual index values according to the preferred embodiment of the present invention, materials for determining the feasibility of a layout, for example, the total area of cells, the total number of nets, the total number of pins, the amount of vertical direction wires, the degree of entanglement of vertical direction wires, and the like are used. All of these materials may be used as the first and the second individual index values, or some of them may be used on demand.

The correlation extracting unit 13 generates an evaluation expression so that a second index value, which is obtained by substituting the second individual index values into the evaluation expression, and its block size have a correlation, for each laid-out netlist.

In the preferred embodiment of the present invention, the following expression (1) is used as the evaluation expression, and evaluation factors 1 to n are decided so that the second index value generated from each laid-out netlist and its block size have a correlation.

$$(\text{index value}) = (\text{evaluation factor 1})*(\text{individual index value 1}) + (\text{evaluation factor 2})*(\text{individual index value 2}) + \ldots + (\text{evaluation factor } n)*(\text{individual index value } n) \quad (1)$$

Here, to decide the evaluation factors 1 to n so that the second index value and its block size have a correlation, for example, the evaluation factors 1 to n may be decided so that the second index value becomes a value close to the block size. Namely, the evaluation factors 1 to n may be decided so that a difference between a value on the right side of the expression (1) and the block size becomes as small as possible for each laid-out netlist.

Accordingly, the evaluation factors 1 to n are decided with a least square method in the preferred embodiment of the present invention. Specifically, the evaluation factors 1 to n are decided so that the value of the following expression (2) becomes a minimum. Since the least square method is a known technique, details of its explanation are omitted. Additionally, the decision of the evaluation factors is not limited to this method as a matter of course. Other multivariate analysis techniques, etc. may be used on demand.

$$\Sigma((\text{block size}) - (\text{evaluation factor 1})*(\text{individual index value 1}) - \ldots - (\text{evaluation factor } n)*(\text{individual index value } n))*((\text{block size}) - (\text{evaluation factor 1})*(\text{individual index value 1}) - \ldots - (\text{evaluation factor } n)*(\text{individual index value n})) \quad (2)$$

The layout evaluating unit 14 identifies a range where the second index value and its block size have a correlation.

Namely, the layout evaluating unit 14 puts a relation between the second index value, which is obtained by substituting second individual index values generated from each laid-out netlist into the expression (1), and its block size into a graph, and identifies a region where the second index value and its block size have a correlation.

For example, as shown in FIG. 12 to be described later, the block size and the second index value are respectively assumed to be X and Y axes, and the block size and the second index value of each laid-out netlist are plotted on the X-Y coordinates. Then, upper and lower limit lines are identified.

The upper limit line according to this preferred embodiment is a straight line on which at least two or more points plotted on the X-Y coordinates exist, and above which no plotted points exist.

Similarly, the lower limit line according to this preferred embodiment is a straight line on which at least two or more points plotted on the X-Y coordinates exist, and below which no plotted points exist.

The layout evaluating unit 14 calculates the first index value by substituting the first individual index set into the expression (1), and determines whether or not the first index value is included in the correlation region on the X-Y coordinates. If the first index value is included in the correlation region, the layout evaluating unit 14 determines that a layout is possible.

FIG. 2 is a block diagram exemplifying the configuration of the layout evaluating apparatus 10 according to the preferred embodiment of the present invention.

The layout evaluating apparatus 10 shown in FIG. 2 comprises a CPU 21 that executes a program for implementing the layout evaluation according to this preferred embodiment in addition to the execution of peripheral devices or various types of software, a volatile memory 22 (such as a RAM) used to execute the program, an input device 23 (such as a keyboard or a mouse), which is means for inputting data externally, an output device 24 for displaying data, etc., an external storage device 25 for storing the program for implementing the layout evaluation according to this preferred embodiment in addition to a program and data, which are required to operate the layout evaluating apparatus 10, a medium driving device 26 for outputting the data of the memory 22 or the external storage device 25 to a portable storage medium 27 (such as a floppy disk, an MO disk, a CD-R, a DVD-R, etc.), or for reading a program, data, etc. from the portable recording medium 27, and a network connecting device 28 for making a connection to a network 29. These constituent elements are interconnected by a bus 20 to mutually transmit/receive data.

In the above described configuration, a layout evaluation process according to the preferred embodiment of the present invention is implemented in a way such that the CPU 21 executes the program instructions stored in the memory 22, etc. Accordingly, the first individual index value generating unit 11, the second individual index value generating unit 12, the correlation extracting unit 13 and the layout evaluating unit 14 are implemented in a way such that the CPU 22 executes the program instructions.

The layout evaluation process is mainly performed by the CPU 22. However, for ease of explanation, the following explanation is provided by assuming that the layout evaluating apparatus 10 mainly performs the layout evaluation process.

Figure 3:
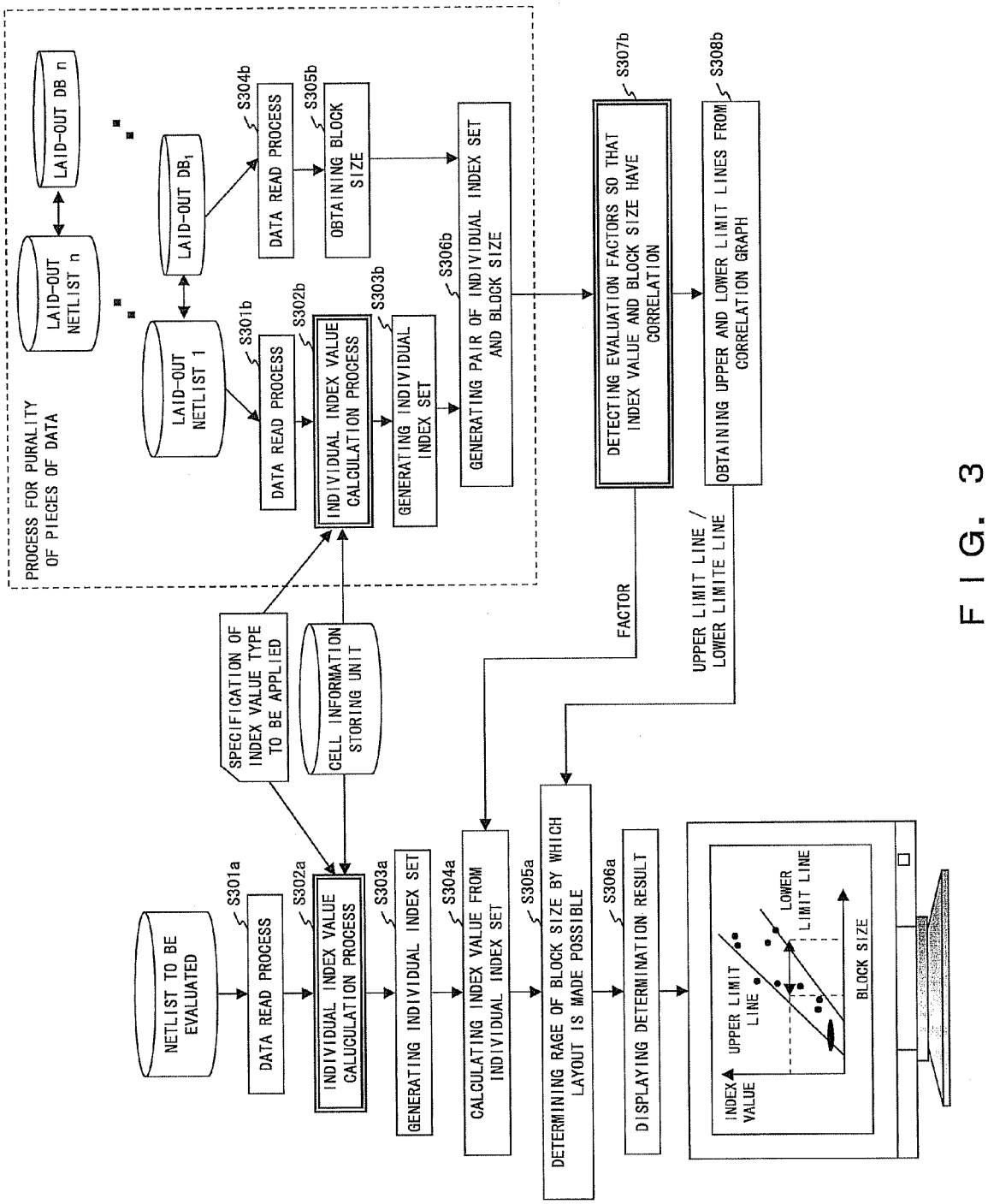
FIG. 3 is a flowchart showing the outline of a process performed by the layout evaluating apparatus according to the preferred embodiment of the present invention.

FIG. 3 is a flowchart showing the outline of the process performed by the layout evaluating apparatus 10 according to the preferred embodiment of the present invention.

A netlist to be evaluated, which is shown in FIG. 3, is a netlist to be evaluated, which is described with reference to FIG. 1 and for which an evaluation of whether or not a layout is possible is conducted. Similarly, laid-out netlists 1 to n are netlists the layout design, etc. of which is complete based on a corresponding netlist, the layout of which is known to be possible, and the block size of which is known.

Additionally, layout DBs 1 to n are design data when a layout design, etc. is made based on a corresponding laid-out netlist. In FIG. 3, design data when a layout design, etc. is made based on a laid-out netlist 1 is represented as a layout DB 1.

The design data used in this preferred embodiment are respectively configured with a block size resultant from a layout design, etc. based on a laid-out netlist, the shape of a cell for each type, the coordinates of a terminal of each cell, the coordinates of arrangement of each cell, the shape of a wire for each net, the coordinates of a wire of each net, etc.

In step S301*a*, the layout evaluating apparatus 10 performs a process for reading from a netlist to be evaluated data required to generate first individual index values. Here, the data required to generate the first individual index values is, for example, the names and the number of cells included in the netlist, and the names of nets.

Upon terminating the data read, the layout evaluating apparatus 10 advances the process to step S302*a*. Then, the layout evaluating apparatus 10 reads cell information (such as the size of a cell for each type, and the like) from a cell information storing unit for storing cell information used in the netlist to be evaluated or in a laid-out netlist. Then, the layout evaluating apparatus 10 generates the first individual index values from the data obtained in steps S301*a* and S302*a*.

Upon terminating the generation of the first individual index values, the layout evaluating apparatus 10 advances the process to step S303*a*. If a plurality of netlists to be evaluated exist, the layout evaluating apparatus 10 groups the first individual index values generated from a netlist to be evaluated into an individual index set (hereinafter referred to as a first individual index set) for each of the netlists to be evaluated.

Here, an example of the structure of the first individual index set according to the preferred embodiment of the present invention is shown in FIG. 4. The first individual index set 40 shown in FIG. 4 is data composed of the netlist number of a netlist to be evaluated, and first individual index values 1 to n, which are calculated from data read from the corresponding netlist in step S302*a*. Also a second individual index set to be described later has a similar structure.

In the meantime, in step S301*b*, the layout evaluating apparatus 10 performs a process for reading from each of the laid-out netlists data required to generate second individual index values. Here, the data required to generate the second individual index values is, for example, the names and the number of cells included in the netlist, the names of nets, etc. in a similar manner as in step S301*a*.

Upon terminating the data read, the layout evaluating apparatus 10 advances the process to step S302*b*. Then, the layout evaluating apparatus 10 reads cell information (the size of a cell for each type, etc.) from the cell information storing unit, and generates the second individual index values from the data obtained in steps S301*b* and S302*b*.

Upon terminating the generation of the second individual index values, the layout evaluating apparatus 10 advances the process to step S303*b*. Then, the layout evaluating apparatus 10 groups the second individual index values generated from the laid-out netlist into an individual index set (hereinafter referred to as a second individual index set) for each of the laid-out netlists.

Additionally, in step S304*b*, the layout evaluating apparatus 10 performs a process for reading design data from a plurality of layout DBs. Upon completing the design data read, the layout evaluating apparatus 10 advances the process to step S305*b*. Then, the layout evaluating apparatus 10 obtains a block size from the design data read in step S304*b*.

After obtaining the second individual index set and the block size, the layout evaluating apparatus 10 advances the process to step S306*b*.

In step S306*b*, the layout evaluating apparatus 10 generates a pair (hereinafter referred to as a second index set) of a second individual index set and its block size for all of second individual index sets.

Here, an example of the second index set according to the preferred embodiment of the present invention is shown in FIG. 5. The second index set 50 shown in FIG. 5 is data composed of the netlist number of a laid-out netlist, second individual index values 1 to n, which are calculated from the data read from the corresponding netlist in step S302*b*, a layout DB number corresponding to the netlist, and a block size read from the corresponding layout DB.

In step S307*b*, the layout evaluating apparatus 10 decides evaluation factors 1 to n in an evaluation expression for each of the second index sets generated in step S306*b* so that the second index value, which is obtained by substituting the second individual index values into the evaluation expression, and its block size have a correlation.

As described above, in this preferred embodiment, the evaluation factors 1 to n are decided with the least square method using the expression (2).

After deciding the evaluation factors 1 to n, the layout evaluating apparatus 10 advances the process to step S308b. Then, the layout evaluating apparatus 10 identifies a range where the second index value and its block size have a correlation. In this preferred embodiment, a correlation range is identified by obtaining upper and lower limit lines in a graph that represents a correlation between a second index value and its block size.

In the meantime, after terminating the process in step S302a or S303a, the layout evaluating apparatus 10 advances the process to step S304a. Then, the layout evaluating apparatus 10 calculates a first index value by substituting the first individual index set into the evaluation expression using the evaluation factors 1 to n decided in step S307b.

Figure 6:
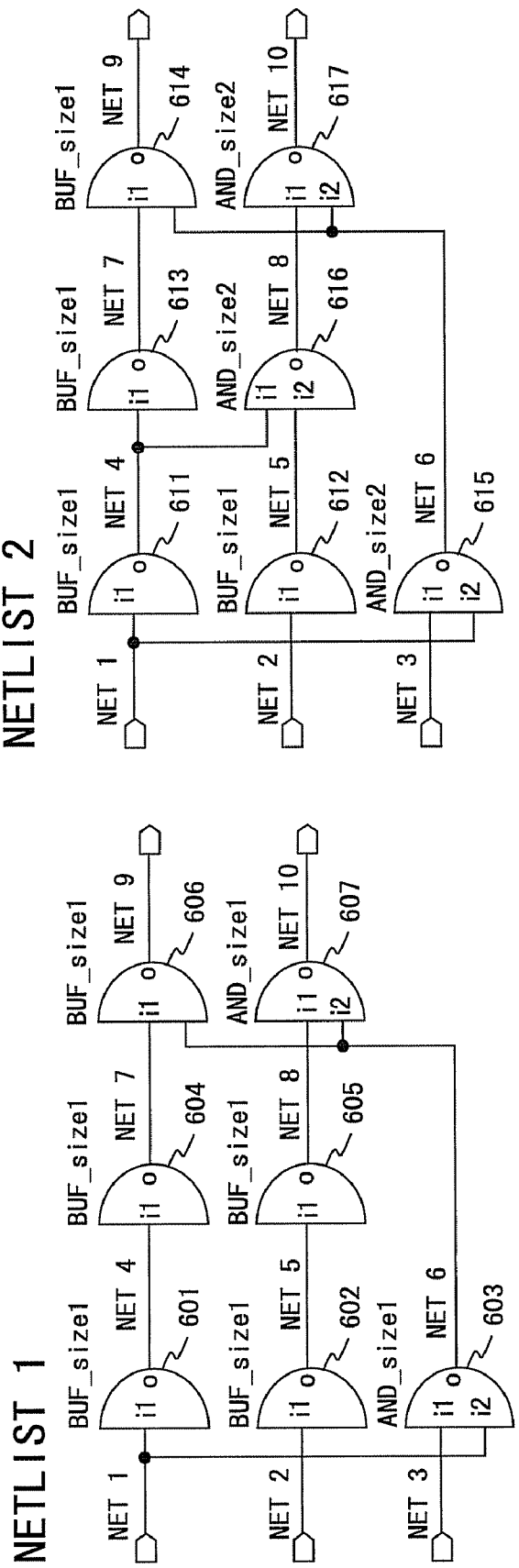
FIG. 6 is a schematic explaining netlists according to the preferred embodiment of the present invention.

For example, a case of netlists (netlists 1 and 2) of a circuit configuration shown in FIG. 6 is considered. The netlist 1 shown in FIG. 6 is composed of cells 601 to 607 of the same size, and nets 1 to 10, whereas the netlist 2 is composed of cells 611 to 614 and 615 to 617, the sizes of which are different, and nets 1 to 10.

Here, if the total area of cells, the number of nets and the number of pins are used respectively as individual index values 1 to 3 in the expression (1), and if it is assumed that the size of the cells 601 to 607 and 611 to 614 is 1, and the size of the cells 615 to 617 is 2, the individual index values of the netlists 1 and 2 become those in a table shown in FIG. 7.

Assume that the evaluation expression is decided as follows by the process of step S307b.

(index value)=5*(total area of cells)+2*(number of nets)+1*(number of pins)   (3)

In this case, the total area of cells, the number of nets and the number of pins, which are shown in FIG. 7, are substituted into the expression (3), whereby the first index values (72 and 88 shown in FIG. 7) are calculated.

After calculating the first index values, the layout evaluating apparatus 10 references the correlation range in the correlation graph, which is identified in step S308b. Then, the layout evaluating apparatus 10 obtains the range of the block size of the first index value in the correlation range.

In step S305a, if the first index value is not included in the correlation range, the layout evaluating apparatus 10 determines that a layout is impossible. Or, if the first index value is included in the correlation range, the layout evaluating apparatus 10 determines that the layout is possible in the range of the block size obtained in step S304a.

For example, if a correlation graph of FIG. 12, which will be described later, is obtained, and if the first index value calculated in step S304a is A, the layout evaluating apparatus 10 determines that the layout is possible within a range of the block size from B to C.

Additionally, if a correlation graph of FIG. 13, which will be described later, is obtained, and if the area of cells per unit area, which is obtained by substituting the first index value A calculated in step S304a into an intermediate line, is D, the layout evaluating apparatus 10 determines, for example, that the layout is easy when the value of D is smaller than a predetermined value, or the layout is difficult when the value of D is larger than the predetermined value. The predetermined value may be decided depending on need.

In step S306a, the layout evaluating apparatus 10 terminates the process after outputting (displaying) a result of the determination made in step S305a to (on) the output device 24.

Figure 8:
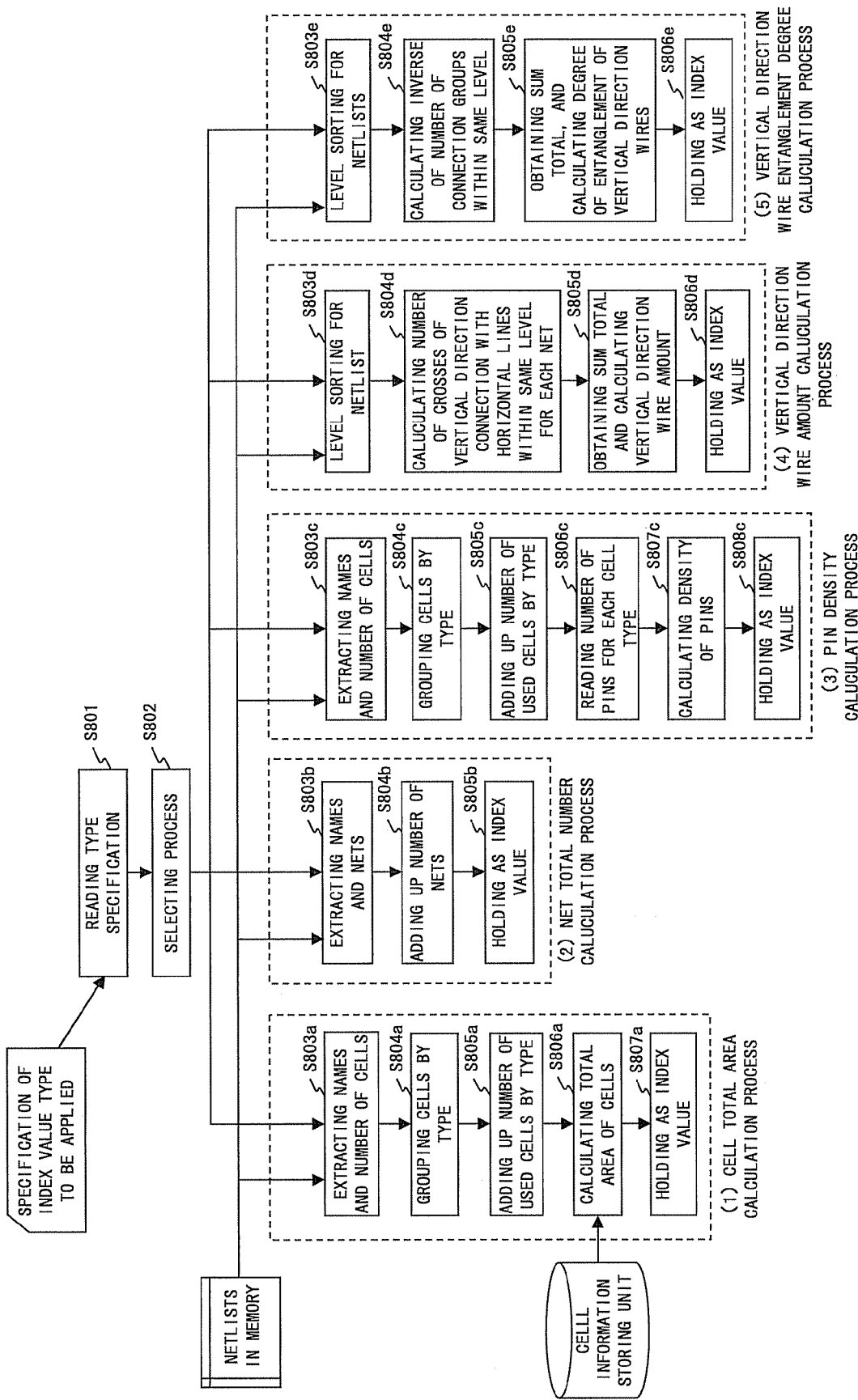
FIG. 8 is a flowchart showing an individual index value calculation process according to the preferred embodiment of the present invention.

FIG. 8 is a flowchart showing an individual index value calculation process performed in steps S302a and S302b shown in FIG. 3.

In step S801, the layout evaluating apparatus 10 obtains pre-specified types of first and second index values (referred to simply as index values in the explanation of FIG. 8), for example, by referencing the memory 22, etc.

In step S802, the layout evaluating apparatus 10 selects a process according to the types of the index values obtained in step S801. Namely, (1) the apparatus 10 advances the process to step S803a if the total area of cells is specified as a type of the index values obtained in step S801, (2) the apparatus 10 advances the process to step S803b if the number of nets is specified, (3) the apparatus 10 advances the process to step S803c if the total number of pins is specified, (4) the apparatus 10 advances the process to step S803d if the amount of vertical direction wires is specified, or (5) the apparatus 10 advances the process to step S803e if the degree of entanglement of vertical direction wires is specified.

The flowchart shown in FIG. 8 represents not that any one of the calculation processes (1) to (5) is selectively performed, but that the calculation processes (1) to (5) are performed for all of the types of the index values obtained in step S801.

(1) Cell Total Area Calculation Process

In step S803a, the layout evaluating apparatus 10 extracts the names and the number of cells from a netlist to be evaluated or a laid-out netlist (referred to simply as a netlist in the explanation of FIG. 8) deployed in the memory 22.

In step S804a, the layout evaluating apparatus 10 groups the cells obtained in step S803a by type. Then, in step S805a, the layout evaluating apparatus 10 adds up the number of cells for each type.

In step S806a, the layout evaluating apparatus 10 reads cell information (the size of a cell for each type) from the cell information storing unit. Then, the layout evaluating apparatus 10 calculates a total area occupied by the cells based on the size of a cell for each type, and the number of cells for each type added up in step S805a.

In step S807a, the layout evaluating apparatus 10 stores the total area of cells calculated in step S806a in the memory 22, etc. as an index value.

(2) Net Total Number Calculation Process

In step S803b, the layout evaluating apparatus 10 extracts all of the names of nets from the netlist deployed in the memory 22. Then, in step S804b, the layout evaluating apparatus 10 adds up the number of the nets extracted in step S803b.

In step S805b, the layout evaluating apparatus 10 stores the number of the nets added up in step S805b in the memory 22, etc. as an index value.

(3) Pin Total Density Calculation Process

In step S803c, the layout evaluating apparatus 10 extracts the names and the number of cells from the netlist deployed in the memory 22.

In step S804c, the layout evaluating apparatus 10 groups the cells obtained in step S803c by type. Then, in step S805c, the layout evaluating apparatus 10 adds up the number of cells for each type.

In step S806c, the layout evaluating apparatus 10 reads cell information (such as the number of pins for each cell type)

from the cell information storing unit. Then, in step S807c, the layout evaluating apparatus 10 calculates the total number of pins, which are comprised by all of the cells, from the number of cells for each type added up in step S805c, and the number of pins for each cell type obtained in step S806c. Then, the layout evaluating apparatus 10 calculates the density of pins by dividing the total number of pins by the total area of cells.

By using the density of pins, the feasibility of a layout can be determined in consideration of the degree of local congestion of wires within the circuit. The density of pins according to this preferred embodiment is calculated by dividing the total number of pins by the total area of cells. However, for example, the density of pins may be obtained for every level after making level sorting, and its maximum value may be used as an index value.

In step S808c, the layout evaluating apparatus 10 stores the density of pins calculated in step S807c in the memory 22, etc. as an index value.

(4) Vertical Direction Wire Amount Calculation Process

In step S803d, the layout evaluating apparatus 10 makes level sorting for netlists.

The level sorting according to this preferred embodiment means a process for sequentially assigning levels to elements, such as assigning a level 1 to an element connected to an input, a level 2 to an element connected to the element of the level 1 . . . . However, if an element is connected to a plurality of elements of different levels, a higher level number is assigned.

For example, in FIG. 9, a level 1 is assigned to cells A to C since they are respectively connected to an input, a level 2 is assigned to cells D and E since they are respectively connected to the cells A and B of the level 1, and a level 3 is assigned to cells F and G since they are respectively connected to the cells D and E of the level 2. The cell G is connected to both of the cell C of the level 1 and the cell E of the level 2. Because priority is given to a higher level in such a case, the level 3 is assigned by recognizing that the cell G is connected to the cell E of the level 2.

In step S804d, the layout evaluating apparatus 10 calculates the number of crosses of a vertical direction connection with horizontal lines. Then, in step S805d, their total number is added up to calculate the amount of vertical direction wires.

For example, as shown in FIG. 9, assume that the same level direction is the vertical direction, and a direction which crosses a boundary between levels is the horizontal direction in this preferred embodiment. On the level 1, since a net A is connected to the cells A and C, it crosses horizontal lines a and b. Accordingly, the number of crosses of the vertical direction connection with the horizontal lines within the level 1 is 2. Since no nets cross the horizontal lines a and b on the level 2, the number of crosses is 0. On the level 3, a net B crosses the horizontal lines a and b, the number of crosses is 2.

By way of example, if the cells B and C are replaced, the number of crosses of the vertical direction connection with the horizontal lines decreases from 2 to 1. If the number of crosses of the vertical direction connection with the horizontal lines varies with the replacement of cells within the same level, its minimum value may be obtained.

In step S806d, the layout evaluating apparatus 10 stores the amount of vertical direction wires calculated in step S805d in the memory 22, etc. as an index value.

(5) Vertical Direction Wire Entanglement Degree Calculation Process

In step S803e, the layout evaluating apparatus 10 makes level sorting for the netlists.

In step S804e, the layout evaluating apparatus 10 calculates the number of connection groups within the same level for all of nets. Furthermore, the layout evaluating apparatus 10 calculates the inverse of the number of connection groups.

A connection group according to this preferred embodiment means a group of cells having a connection within the same level. For example, since cells A and B, B and C, C and D, and D and A are cells respectively having a connection within the same level as shown in FIG. 10, they form one connection group 101. At this time, the number of connection groups is 1.

Additionally, since cells E and F, and G and H are cells respectively having a connection within the same level, they respectively form connection groups 102 and 103. At this time, the number of connection groups is 2.

In step S805e, the layout evaluating apparatus 10 obtains the total sum of the inverse of the number of connection groups calculated in step S804e, and calculates the degree of entanglement of vertical direction wires.

As the number of connection groups decreases, the number of crosses of wires increases. Therefore, a layout becomes difficult. Namely, an index indicates that a layout becomes more difficult as the degree of entanglement becomes higher.

In step S806e, the layout evaluating apparatus 10 stores the degree of entanglement of vertical direction wires calculated in step S805e in the memory 22, etc. as an index value.

Figure 11:
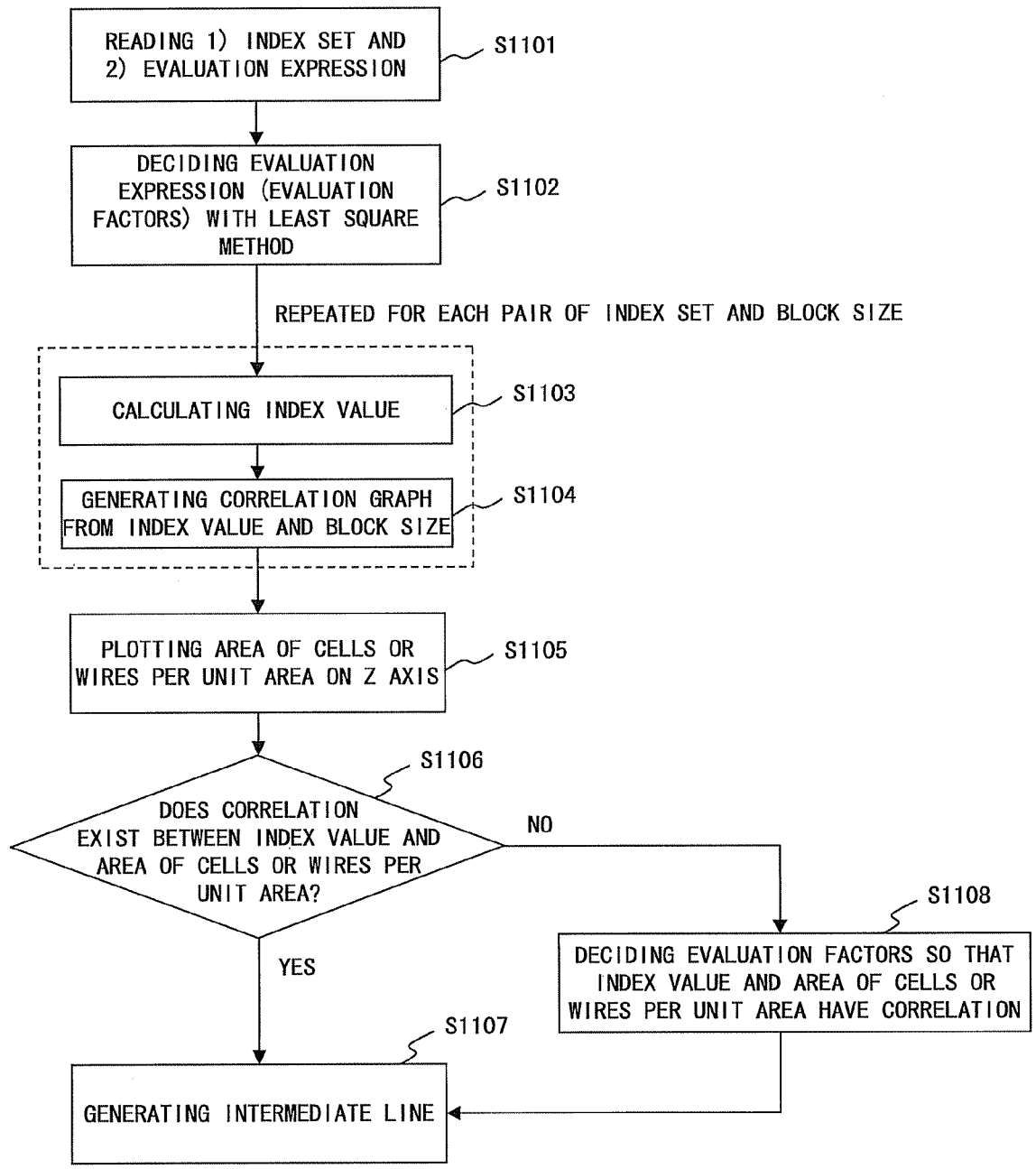
FIG. 11 is a flowchart showing an evaluation factor decision process according to the preferred embodiment of the present invention.

FIG. 11 is a flowchart showing the evaluation factor decision process performed in step S307b shown in FIG. 3.

Upon completing the generation of the second index set in step S306b shown in FIG. 3, the layout evaluating apparatus 10 transfers the process to step S1101.

In step S1101, the layout evaluating apparatus 10 obtains the second index set generated in step S306b from the memory 22, etc. The layout evaluating apparatus 10 also obtains the evaluation expression (the evaluation factors 1 to n configuring the evaluation expression (1)) from the memory 22, etc.

In step S1102, the layout evaluating apparatus 10 respectively substitutes the second index set and the evaluation factors 1 to n, which are obtained in step S1101, into the expression (2) to decide the evaluation factors 1 to n so that the value calculated with the expression (2) becomes a minimum.

In step S1103, the layout evaluating apparatus 10 calculates the second index value by substituting the second individual index set into the evaluation expression using the evaluation factors 1 to n decided in step S1102 for each second index set.

In step S1104, the layout evaluating apparatus 10 generates a correlation graph by plotting the second index value calculated in step S1103 and its block size on the X-Y coordinates for each second index set.

Here, an example of the correlation graph according to this preferred embodiment is shown in FIG. 12. A (positive) correlation is proved to exist between the second index value calculated in step S1103 and its block size. In FIG. 12, also the upper and the lower limit lines, which are obtained in step S308b, and the first index value calculated in step S304a are shown for reference. For example, if the first index value is A, and if the block size is within a range from B to C, it is determined that a layout is possible.

Furthermore, the following process is performed in this preferred embodiment.

In step S1105, the layout evaluating apparatus 10 obtains the area of cells per unit area from the design data read in step S304b shown in FIG. 3. Then, the layout evaluating apparatus 10 adds a Z axis on the X-Y coordinates plotted in step S1104, and respectively plots the area of cells per unit area, which corresponds to the second index value.

In step S1106, the layout evaluating apparatus 10 determines whether or not a correlation exists between the second index value and the area of cells (or wires) per unit area, which is plotted in step S1105. For example, a correlation may be determined if a correlation factor is equal to or larger than 0.5 when being calculated.

If the correlation is determined to exist, the layout evaluating apparatus 10 advances the process to step S1107. Or, if the correlation is determined not to exist, the layout evaluating apparatus 10 transfers the process to step S1108.

In step S1107, the layout evaluating apparatus 10 creates an intermediate line in a range where the second index value and the area of cells (or wires) per unit area have the correlation on the X-Y coordinates. For example, as indicated by step S308b, the upper and the lower limit lines in the graph representing the correlation between the second index value and the area of cells per unit area are obtained, and the intermediate line between the upper and the lower limit lines may be obtained.

In the meantime, in step S1108, the layout evaluating apparatus 10 decides the evaluation factors 1 to n by using a technique similar to that in steps S1101 and S1102 so that a value calculated with an expression (4) becomes a minimum by substituting the second index set obtained in step S1101, the area of cells per unit area calculated from the block size, and the evaluation factors 1 to n into the expression (4).

$$\Sigma((\text{area of cells per unit area}) - (\text{evaluation factor 1})^* \\ (\text{individual index value 1}) - \ldots - (\text{evaluation factor } n)^*(\text{individual index value } n))^*((\text{area of cells per unit area}) - (\text{evaluation factor 1})^*(\text{individual index value 1}) - \ldots - (\text{evaluation factor } n)^*(\text{individual index value } n)) \quad (4)$$

After deciding the evaluation factors 1 to n, the layout evaluating apparatus 10 adds a Z axis on the X-Y coordinates plotted in step S1104, and plots the area of cells per unit area corresponding to the second index value in a similar manner as in step S1105. Then, the layout evaluating apparatus 10 transfers the process to step S1107.

Figure 13:
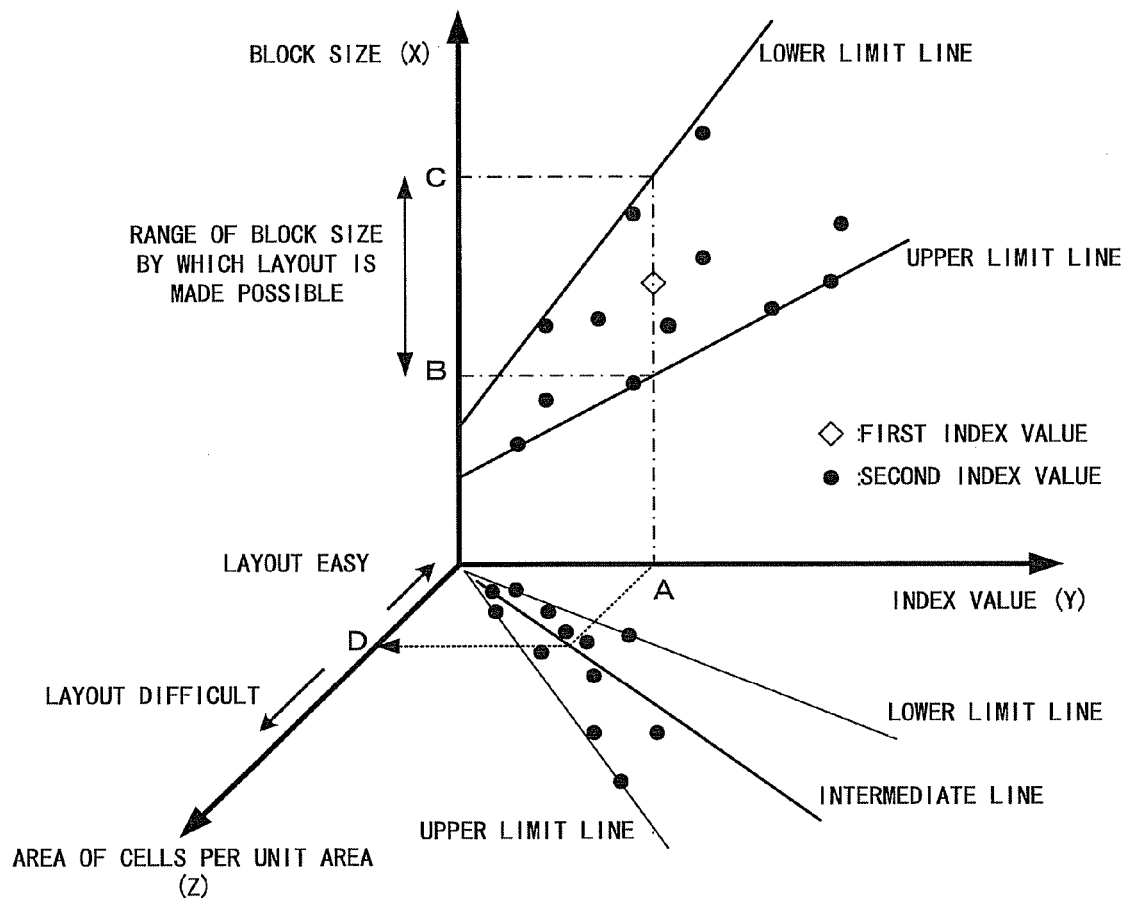
FIG. 13 is a schematic exemplifying a correlation graph according to the preferred embodiment of the present invention.

With the above described processes, for example, the correlation graph using the X-Y-Z coordinates shown in FIG. 13 is obtained. The correlation graph shown in FIG. 13 is a graph where the area of cells per unit area, which corresponds to the second index value of the correlation graph shown in FIG. 12, is plotted on the Z axis.

If the first index value is A, an area D of cells per unit area is obtained from the intermediate line. If D is smaller than a predetermined value, a layout is determined to be easy. If D is larger than the predetermined value, the layout is determined to be difficult.

Therefore, according to this preferred embodiment, not only the feasibility of a layout but also the degree of difficulty of the layout can be determined.

In this preferred embodiment, the area of cells per unit area is used as the Z axis. However, the Z axis is not limited to this implementation. An added-up value, which is extracted from an actual layout and represents the degree of difficulty of a layout, such as the area of wires per unit area, etc. may be used.

Additionally, a block size is used in this preferred embodiment. However, a value obtained by dividing a block size, for example, by a NAND gate size may be used as an alternative to the block size. This enables also data designed with CMOS of a different generation to be utilized as a laid-out netlist or a layout DB according to this preferred embodiment.

As described above, according to this preferred embodiment, a first index value is calculated from a netlist to be evaluated. In the meantime, a second index value is calculated from design data (a laid-out netlist or a layout DB), the layout of which is already complete, to identify a correlation range. If the first index value is included in the correlation range, it is determined that the layout is possible. As a result, the feasibility of a layout is enabled to be determined from information only about the netlist to be evaluated.

Furthermore, the block size by which the first index value is included in the correlation range is obtained, whereby the block size that makes the layout possible can be calculated.

What is claimed is:

1. A layout evaluating apparatus for evaluating feasibility of a layout of a desired circuit by using first logic information representing a connection state of the desired circuit, comprising:

a first individual index value generating unit for generating first individual index values, which become materials for determining whether or not the layout of the desired circuit is possible, from the first logic information;

a second individual index value generating unit for generating second individual index values, which become materials for determining whether or not the layout of the desired circuit is possible, from second logic information representing a connection state of a circuit a layout of which has been designed to be possible;

a correlation extracting unit for generating an evaluation expression for calculating a second index value corresponding to the second logic information so that the second index value, which is calculated with the second individual index values, and a block size in the second logic information have a correlation; and a layout evaluating unit for identifying a range where the second index value and the block size have the correlation in the second logic information, and for determining that the layout of the desired circuit is possible if a first index value, which is calculated from the evaluation expression by replacing the second individual index values in the evaluation expression with the first individual index values, is included in the range, and wherein the evaluation expression calculates a product of the first or the second index value and predetermined factors for each first or second index value, and calculates a total sum of the product and the predetermined factors are factors decided so that the second index value, which is calculated with the second individual index values for each piece of the second logic information, and the block size in the second logic information have a correlation.

2. The layout evaluating apparatus according to claim 1, wherein any one or more of a total area of cells, a total number of nets, density of pins, an amount of vertical direction wires, and a degree of entanglement of vertical direction wires are used as the first and the second individual index values.

3. The layout evaluating apparatus according to claim 1, further comprising a layout difficulty degree evaluating unit for identifying a range of a correlation between the second index value and a third index value extracted from the layout of the circuit represented by the second logic information, and for determining a degree of difficulty of a layout according to a position of the first index value, which is calculated by replacing the second individual index values in the expression with the first individual index values, within the range.

4. The layout evaluating apparatus according to claim 3, wherein
any one of an area of cells per unit area and an area of wires per unit area, which are extracted from the layout of the circuit represented by the second logic information, is used as the third index value.

5. The layout evaluating apparatus according to claim 1, further comprising:
a correlation extracting unit for generating a difficulty degree evaluation expression for calculating the second index value so that the second index value, which is calculated with the second individual index values for each piece of the second logic information, and a third index value extracted from the layout of the circuit represented by the second logic information have a correlation; and
a layout difficulty degree evaluating unit for identifying a range where the second index value and the third index value have the correlation in the second logic information, and for determining a degree of difficulty of a layout according to a position of the first index value, which is calculated by replacing the second individual index values in the difficulty degree evaluation expression with the first individual index values, within the range.

6. The layout evaluating apparatus according to claim 1, wherein
a value obtained by dividing the block size by a size of a predetermined cell is used as a replacement for the block size.

7. The layout evaluating apparatus according to claim 1, wherein
said layout evaluating unit identifies a range of the block size required to include the first index value within the range, and determines the range as a range of a block size by which a layout is made possible.

8. A layout evaluating method for evaluating feasibility of a layout of a desired circuit by using first logic information representing a connection state of the desired circuit, comprising:
generating first individual index values, which become materials for determining whether or not the layout of the desired circuit is possible, from the first logic information;
generating second individual index values, which become materials for determining whether or not the layout of the desired circuit is possible, from second logic information representing a connection state of a circuit a layout of which has been designed to be possible;
generating an evaluation expression for calculating a second index value corresponding to the second logic information so that the second index value, which is calculated with the second individual index values, and a block size in the second logic information have a correlation; and
identifying a range where the second index value and the block size have the correlation in the second logic information, and determining that the layout of the desired circuit is possible if a first index value, which is calculated from the evaluation expression by replacing the second individual index values in the evaluation expression with the first individual index values, is included in the range, and wherein the evaluation expression calculates a product of the first or the second index value and predetermined factors for each first or second index value, and calculates a total sum of the product and the predetermined factors are factors decided so that the second index value, which is calculated with the second individual index values for each piece of the second logic information, and the block size in the second logic information have a correlation.

9. The layout evaluating method according to claim 8, further comprising identifying a range of a correlation between the second index value and a third index value extracted from the layout of the circuit represented by the second logic information, and determining a degree of difficulty of a layout according to a position of the first index value, which is calculated by replacing the second individual index values in the expression with the first individual index values, within the range.

10. The layout evaluating method according to claim 8, further comprising:
generating a difficulty degree evaluation expression for calculating the second index value so that the second index value, which is calculated with the second individual index values for each piece of the second logic information, and a third index value extracted from the layout of the circuit represented by the second logic information have a correlation; and
identifying a range where the second index value and the third index value have the correlation in the second logic information, and determining a degree of difficulty of a layout according to a position of the first index value, which is calculated by replacing the second individual index values in the difficulty degree evaluation expression with the first individual index values, within the range.

11. A medium for storing a layout evaluating program, which is intended to evaluate feasibility of a layout of a desired circuit by using first logic information representing a connection state of the desired circuit, for causing an information processing device to execute a layout evaluating process, the process comprising:
generating first individual index values, which become materials for determining whether or not the layout of the desired circuit is possible, from the first logic information, and storing the first individual index values in a storing unit;
generating second individual index values, which become materials for determining whether or not the layout of the desired circuit is possible, from second logic information representing a connection state of a circuit a layout of which has been designed to be possible, and storing the second individual index values in the storing unit;
reading the second individual index values from the storing unit, and generating an evaluation expression for calculating a second index value corresponding to the second logic information so that the second index value, which is calculated with the second individual index values, and a block size in the second logic information have a correlation; and
identifying a range where the second index value and the block size have a correlation in the second logic information, reading the first individual index values from the storing unit, and determining that the layout of the desired circuit is possible if a first index value, which is calculated from the evaluation expression by replacing the second individual index values in the evaluation expression with the first individual index values, is included in the range, and wherein the evaluation expression calculates a product of the first or the second index value and predetermined factors for each first or second index value, and calculates a total sum of the product and the predetermined factors are factors decided so that the second index value, which is calculated with the second individual index values for each piece of the second logic information, and the block size in the second logic information have a correlation.

12. The medium for storing the layout evaluating program according to claim 11, the process further comprising identifying a range of a correlation between the second index value and a third index value extracted from the layout of the circuit represented by the second logic information, and determining a degree of difficulty of a layout according to a position of the first index value, which is calculated by replacing the second individual index values in the expression with the first individual index values, within the range.

13. The medium for storing the layout evaluating program according to claim 11, the process further comprising:

generating a difficulty degree evaluation expression for calculating the second index value so that the second index value, which is calculated with the second individual index values for each piece of the second logic information, and a third index value extracted from the layout of the circuit represented by the second logic information have a correlation; and identifying a range where the second index value and the third index value have the correlation in the second logic information, and determining a degree of difficulty of a layout according to a position of the first index value, which is calculated by replacing the second individual index values in the difficulty degree evaluation expression with the first individual index values, within the range.

* * * * *